(12) United States Patent
Schade van Westrum et al.

(10) Patent No.: US 7,220,450 B2
(45) Date of Patent: May 22, 2007

(54) PROCESS FOR COATING SUBSTRATES USING VAPOUR DEPOSITION

(75) Inventors: Johannes Alphonsus Franciscus Maria Schade van Westrum, Zevenaar (NL); Joannes Leonard Linden, Eindhoven (NL); Johannes Franciscus Maria Velthuis, Leiden (NL)

(73) Assignee: Corus Technology B.V., Velsen-Noord (NL)

( * ) Notice: Subject to any disclaimer, the term of this patent is extended or adjusted under 35 U.S.C. 154(b) by 0 days.

(21) Appl. No.: 10/333,039

(22) PCT Filed: Jul. 17, 2001

(86) PCT No.: PCT/NL01/00546

§ 371 (c)(1),
(2), (4) Date: Aug. 8, 2003

(87) PCT Pub. No.: WO02/06558

PCT Pub. Date: Jan. 24, 2002

(65) Prior Publication Data

US 2004/0022942 A1 Feb. 5, 2004

(30) Foreign Application Priority Data

Jul. 17, 2000 (EP) .................................. 02025591

(51) Int. Cl.
*C23C 16/00* (2006.01)
(52) U.S. Cl. ................ 427/248.1; 427/250; 427/255.28
(58) Field of Classification Search ............. 427/248.1, 427/250, 255.28; 118/715
See application file for complete search history.

(56) References Cited

U.S. PATENT DOCUMENTS

| | | | | |
|---|---|---|---|---|
| 4,533,383 A | * | 8/1985 | Miura et al. ................... 75/351 |
| 4,888,211 A | * | 12/1989 | Oka et al. .................... 427/130 |
| 5,104,634 A | * | 4/1992 | Calcote ....................... 423/446 |
| 5,256,205 A | * | 10/1993 | Schmitt et al. ..... 118/723 MW |
| 5,411,591 A | * | 5/1995 | Izu et al. ..................... 118/718 |
| 5,725,672 A | * | 3/1998 | Schmitt et al. .............. 118/715 |
| 5,728,224 A | * | 3/1998 | Laurent et al. ............. 118/718 |
| 5,874,131 A | * | 2/1999 | Vaartstra et al. ............ 427/250 |
| 5,919,310 A | * | 7/1999 | Fujioka et al. .............. 118/718 |
| 6,165,554 A | * | 12/2000 | Halpern et al. .......... 427/248.1 |
| 6,190,732 B1 | * | 2/2001 | Omstead et al. ......... 427/248.1 |
| 6,230,731 B1 | * | 5/2001 | Miller et al. ............. 137/15.18 |
| 6,309,508 B1 | * | 10/2001 | Lemme et al. ................ 159/49 |
| 6,409,837 B1 | * | 6/2002 | Hillman ...................... 118/712 |
| 6,576,061 B1 | * | 6/2003 | Moriyama et al. .......... 118/719 |
| 6,804,285 B2 | * | 10/2004 | Ohmi et al. ................... 372/58 |

FOREIGN PATENT DOCUMENTS

| | | |
|---|---|---|
| BE | 10 10 720 A3 | 12/1998 |
| DE | 28 07 803 A1 | 9/1978 |
| WO | WO 97/47782 | 12/1997 |

\* cited by examiner

*Primary Examiner*—Bret Chen
(74) *Attorney, Agent, or Firm*—Lucas & Mercanti, LLP

(57) ABSTRACT

The invention relates to a process for applying a coating to a substrate wherein the coating is formed of at least two components or elements. In a preferred embodiment, the coating is formed of at least two metals. In accordance with the invention, the coating is applied by vapor deposition under choking conditions.

9 Claims, 6 Drawing Sheets

PROCESS FOR COATING SUBSTRATES USING VAPOUR DEPOSITION

This patent application claims a benefit of priority from European Patent Application No. 00202559.1 filed Jul. 17, 2000 through PCT Application Ser. No. PCT/NL01/00546 filed Jul. 17, 2001, the contents of each of which are incorporated herein by reference.

The invention relates to a process for applying a coating of at least two elements to a substrate in a vapour deposition method.

Deposition of an element, such as a metal, onto a substrate to provide a coating from a vapour of the element is known in the art. Often the element to be deposited is zinc, and it is regularly deposited on steel strips.

A conventional apparatus used to this end typically comprises an evaporation vessel in which the element is vapourised in front of the surface of the substrate. Sometimes a channel leads the vapour of the metal to the surface of the substrate, which runs at the opening of the channel. The evaporation is usually effected with the aid of vacuum. The substrate is relatively cold when compared to the vapour, so that the vapour de-sublimates onto it to form the objective coating. The transition from gas phase to solid is denoted as de-sublimation, whereas the reverse transition is denoted as sublimation.

When the coating is to be formed of one element only, such as zinc, the described above procedure works satisfactorily. However, when a coating is to be formed of two or more elements, problems arise.

Generally, for the deposition of two elements, one evaporation vessels used, containing the two elements, or two vessels are used, each vessel containing one element. In case of deposition of more than two elements, similar vessels or combination of vessels and setup is used.

Typically the vapour saturation pressure curve of each of the elements used for composing the coating is quite different from that of the others. Especially in the case when one vessel is used containing two or more elements, this gives difficulty controlling the vapour ratio, and often a disproportionate loss occurs of one element. In the case two vessels are used the vapours that are produced in these vessels are led, through separate channels, when present, to the substrate. Before the vapours reach the substrate's surface, they must have a predefined composition at a predefined flow rate and must be thoroughly mixed. This is where the problems arise.

Combining two or more gasses, or vapours, at fixed flows and ratio's, which is necessary for achieving a constant quality (thickness and composition) of the coating, in general proves difficult. Due to interactions of the gasses, these may flow in undesired directions. Typically the vapour pressure and temperature of each of the elements used for composing the coating is quite different from that of the others. As a result, the vapours, and more importantly, the vapour sources in the evaporation chambers become polluted with vapours of the other elements involved in the deposition process. Also, the vapour having the smaller vapour pressure may be prevented from deposition altogether.

In accordance with the invention, it has been found that these problems associated with a process for vapour depositing a coating of at least two elements may be overcome by employing choking conditions. Accordingly, the invention relates to a process for applying a coating to a substrate, wherein at least a first and a second vapour are deposited on said substrate under choking conditions.

When the vapours of the various elements used for making up the coating are transported from the evaporation chamber to the substrate under true choking conditions, the chances of pollution of a vapour or a vapour source with another vapour are significantly reduced, if not taken away altogether. Furthermore, the use of choking conditions allows for a good control of the process, in particular of the flow of the vapours, and thus of the composition uniformity and thickness of the coating.

It is to be noted that the present process may be carried out in a batch-wise, a continuous or semi-continuous manner. The benefits of the invention, however, are most apparent in a continuous or semi-continuous process.

Figure 1:
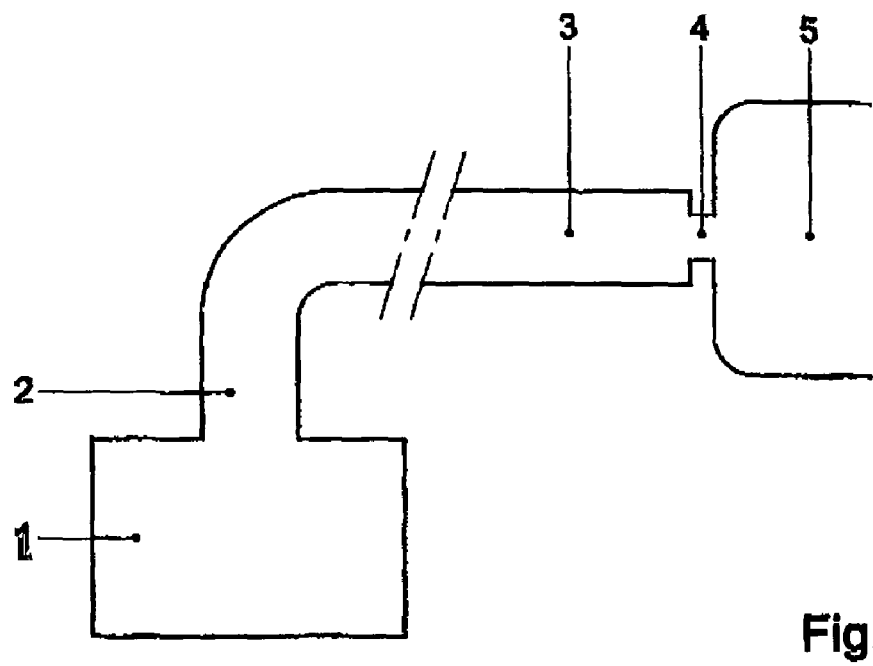
FIG. 1 illustrates the phenomenon of choking conditions using an embodiment of the present invention.

The general phenomenon of choking will now be explained with reference to FIG. 1. For the derivation of formulas and backgrounds is referred to standard textbooks.

Say a vapour flows from a source in a vessel (1) via a vapour line (2, 3) and via a restriction (4) to location (5). A restriction is the location with the smallest cross sectional flow area, which the flow encounters on its way. This smallest cross sectional flow area may take many alternative forms, for example an orifice plate with one or more perforations, slits, etceteras. The pressure in the vessel (1) is denoted P1. The pressure downstream of the restriction (4) is the back pressure Pb (5). Assume that initially the back pressure (5) equals the pressure in the vessel (1). In that case the pressure difference over the vapour line is zero and consequently the flow is zero. Now, if the back pressure (5) is steadily lowered, the flow rate increases, and the velocity at the restriction becomes higher and higher. Arriving at a certain back pressure however, the velocity at the restriction (4) becomes sonic and the flow rate reaches a maximum.

Sonic means that the Mach number 'M', which is defined as the local vapour velocity divided by the local speed of sound, becomes unity. The flow is then choked.

Further reduction of the back pressure (5) does not increase the flow rate anymore. Properties of a vapour when it is flowing at Mach 1 are called critical properties, and are identified by means of an asterisk (\*). A condition for choking therefore is that the back pressure (5) is lower or equal than the critical pressure $P_b<P^*$ at the restriction (4). The flow rate at choking conditions can be expressed in terms of stagnation conditions at the restriction (4), given by the following well-known expression (1).

$$\dot{m} = C \cdot A^* \cdot \frac{p_0}{\sqrt{T_0}} \sqrt{\frac{\gamma \cdot M_w}{R}} \sqrt{\left(\frac{2}{\gamma+1}\right)^{\frac{\gamma+1}{\gamma-1}}} \text{ where} \quad (1)$$

$\dot{m}$=massflowrate [kg/s]
C=correction factor [-], C≈0.85 for thin orifice plates
A\*=surface area of restriction [m³]
$T_0$=stagnation temperature [K]

$$\gamma = \frac{c_p}{c_v}$$

the ratio of the specific heat capacities at constant pressure and constant volume [-]
M=molecular weight [kg/mole]
R=universal gasconstant [J/kgmoleK]
p\*=critical pressure at restriction [Pa]]
$P_0$=stagnation pressure [Pa]]

Expression (1) also applies for a mixture of gases as long as the proper mixture properties are inserted.

At any point in the device, the flowing gas has a particular temperature, pressure, enthalpy, etceteras. If the velocity of that point where instantaneously brought to zero (frictionless adiabatic or isentropic deceleration), those properties would take on new values, known as their stagnation conditions and indicated in the equations by a zero as index. The critical properties of the flow at a certain location can be related to its stagnation properties. For the pressure this relation is given by:

$$\frac{p^*}{p_0} = \left(\frac{2}{\gamma+1}\right)^{\frac{\gamma}{\gamma-1}} (= 0.5283 \text{ in case of air for which } \gamma \approx 1.4) \quad (2)$$

To control the deposition process it is useful to relate the stagnation and critical properties at the restriction (4), and thus the mass flow defined by equation 1, to properties upstream of the restriction, for example at the properties in the evaporation vessel (1). If the flow is frictionless adiabatic (isentropic) throughout the vessel and vapour line up to the restriction, the stagnation properties are constant everywhere, which considerably simplifies the analysis. If the flow is not frictionless adiabatic, the stagnation conditions at the different location are not constant anymore, but still can be related to each other, for which is referred to standard textbooks. If the gas originating from a choking restriction is deposited, and there are no losses to the environment, the mass rate of coating deposited equals the mass flow rate of gas as calculated by equation (1), which simplifies deposition calculations. In reality a certain loss will have to be accepted, which can be accounted for in the calculation by introducing a loss factor.

The relations and procedure described above provide a means to control the critical pressure and mass flow rate to a certain design value, as is favourable in a vapour deposition process according to the invention.

Though not strictly necessary, a simplification of the relation and procedure described above is attractive and not very difficult to realise.

First of all, as already mentioned, a simplification is achieved when the flow is adiabatic and frictionless (isentropic). This can be achieved by heating the walls of the vessel and vapour line to a temperature comparable of that of the vapour, thereby minimising heat interaction. If the dimensions of ducts and the like are rather large, bends are limited, flow velocities and flow gradients are low and thus friction effects can be minimised. As a result, it is achieved that the stagnation conditions are constant throughout the device from point (1) in the vessel to the point of the restriction (4).

Secondly, if the flow is isentropic and the dimensions of the vapour source are dimensioned in such a way that the vapour velocity at the source (1) is negligible, the stagnation conditions at (4) and intennediate points, are equal to the conditions in the evaporation vessel. In that case, stagnation pressure equals the vapour pressure over the molten metal in the evaporation vessel, and the stagnation temperature equals the temperature of the molten metal. The vapour pressure over the molten metal in the vessel is directly related to the temperature of the molten metal by the saturation pressure curve, which is known or can be measured. Now the expression (1) for the flow rate under choked conditions becomes quite simple, because the temperature and vapour pressure of the melt can be substituted for the stagnation temperature and pressure. Also the expression (2) for the critical pressure becomes simple, because the critical pressure now is proportional to the vapour pressure over the molten metal.

The material used as the substrate is in principle not very critical. Many different materials may be provided with a coating in accordance with the present process. Of course, the material should be able to withstand the conditions used during the process, which refers mainly to the temperatures and pressures the substrate is inevitably exposed to. Typical examples of materials that may be coated are metal and ceramic materials, glass and plastics. Preferably, the substrate is in the form of sheet or foil.

Figure 2:
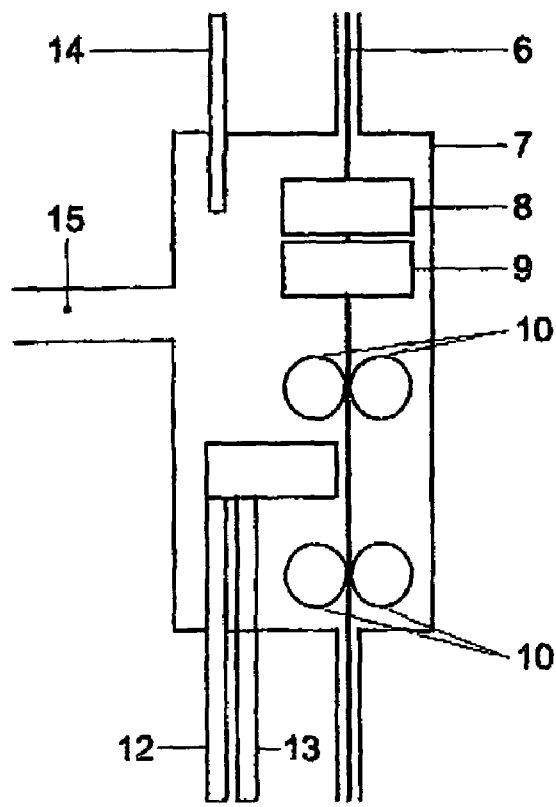
FIG. 2 illustrates possible treatments that the substrate may be subjected to before and after coating.

The substrate may be subjected to various treatments before and after it is coated. These will be elucidated with reference to a possible process setup which is illustrated in FIG. 2. Examples of such treatments are cleaning, annealing and the like. In the coating process, the substrate (6) may be continuously fed into a vacuum chamber (7) by a sealing mechanism and may receive further treatments such as surface cleaning (8). The transport direction of the substrate is depicted by the arrow. To ensure a good adherence of the coating, the temperature of the substrate prior to and/or during the deposition may be controlled. This can for instance be done by using an induction heater (9) to heat the substrate, or by conduction heating by leading the substrate over a temperature controlled roller (10) or surface.

Next, the substrate passes a deposition unit (11), where it receives vapour deposition up to the desired thickness of the coating. There can be several deposition units and substrate control units placed next to each other. This allows for multiple depositions or double sided depositions.

Deposition takes place under a controlled atmosphere to prevent contamination of the substrate. The composition of the vacuum is actively controlled by supplying an inert gas, such as argon, (14) to the chamber and by pumping means (15). At start-up (stop) of the process and heating up (cooling down) of the system, the pressure in the vacuum chamber is of the same order or higher as the vapour pressure of the vapour sources (not shown) to prevent vapours from entering the vacuum chamber and depositing in the vacuum system. This may be used instead of or in combination with mechanical shutters in the vapour inlets (12, 13) when the system is ready to start, the chamber is evacuated and the shutters are opened so that the vapour can flow.

At deposition, the walls are preferably heated well enough to prevent premature condensation or de-sublimation of vapours. Preferably the walls of the device that are into contact with the vapours should have a temperature equal to the temperature of the vapour leaving the melting unit (the vapour source). Overheating of the vapour is achieved by taking the wall temperatures higher than indicated before. However the amount of overheating achieved in this way is rather uncontrolled. If overheating is necessary, preferably overheating of the vapour should be performed in a controlled manner, for example using a heat exchanger or for example by introducing a porous conducting plug into a vapour line through which the vapour travels and which is induction heated.

The temperature of the substrate is controlled in such way that the substrate is cold enough for the vapour to de-sublimate on the substrate, to prevent a liquid film to be formed, and to prevent major re-evaporation of the film, but warm enough to ensure good adherence of the coating. The conditions, particularly the temperatures, may be adjusted to the chosen materials on the basis of normal skills of the artisan.

After deposition has been completed to the desired extent, the substrate may be led outside the vacuum chamber using a sealing mechanism.

In accordance with the invention, the coating is composed of at least two elements. In principle, the number of elements used for making the coating is not restricted by an upper limit. However, the process setup may become rather complicated the more elements are involved. Given the applications for which the coated substrates will generally be intended, usually no more than three and preferably two elements are involved. A typical combination is zinc and magnesium.

The word element used herein does not necessarily refer to pure elements as listed in the Periodic Table, but may also refer to compounds. It merely reflects that the substance that is referred to will become part of the coating. Generally, the vapours will be composed of pure compounds.

In a preferred embodiment, the elements will be metals. Thus, the coating will be a metallic coating, composed of an alloy of at least two metals. The choice for the metals used will depend on the desired properties of the coating and on the intended application of the coated substrate. Good results have been obtained using zinc and magnesium for providing a coating of a zinc-magnesium alloy.

As has been mentioned, it is an important aspect of the invention that choking conditions are employed. Choking conditions may conveniently be achieved by use of restrictions. These further allow for control of the mass flow of the different vapours. If the back pressure after a restriction is lower than or equal to the so-called critical pressure in the restriction, the flow at the restriction becomes sonic (reaches sound-speed). In that case the mass flow of a vapour is solely determined by the upstream stagnation pressure and surface area of the restriction, and does not depend anymore on the downstream pressure. Thus control over the mass flow rate and thus coating thickness is simplified. By careful design of the deposition unit (preventing friction effects, heat interaction shocks) the upstream stagnation pressure is equal to the vapour pressure over the vapour source e.g; the molten metal, and thus is solely determined by the temperature of the molten metal. Thus the flow rate (coating thickness) depends only on melt temperature and area of the restriction.

Under certain circumstances it may be difficult to ensure that choking conditions are maintained for each vapour flow. Due to downstream interactions of vapours and pressure fields after the restrictions, choking conditions may be difficult to ensure for every restriction. In that case the mass flow rates also depend on the downstream pressures, and thus is not very well defined anymore. Part of the present invention is the selection of the upstream vapour pressures, thereby minimising interactions downstream of the restrictions. It has been found that the difficulties in maintaining true choking conditions may be overcome by suitably selecting the critical pressures of all vapour flows.

This feature of the invention may thus be explained by the following two embodiments:

EMBODIMENT 1

Two vapours are to be mixed using a choked restriction for vapour 1 and a choked restriction for vapour 2. The conditions (melt temperature) of each vapour is now selected in such way that the critical pressures at the two restrictions are approximately equal. The surface areas of each restriction is selected as to give the proper mass flow rates and vapour ratio's.

EMBODIMENT 2

Two vapours are to be mixed. A choked restriction ('a') is used to inject vapour 1 at a controlled rate into vapour flow 2. The mixture of vapour 1 and vapour 2 is now fed through another choking restriction ('b'), before it is deposited. In this case condition of vapour 1 is now selected in such way that the critical pressure in restriction 1 is equal or higher than the pressure of vapour 2 (upstream restriction 'b'). The surface areas of each restriction is selected as to give the proper mass flow rates and vapour ratio's.

These examples can be extended to mixing of more than two vapours.

Figure 3A:
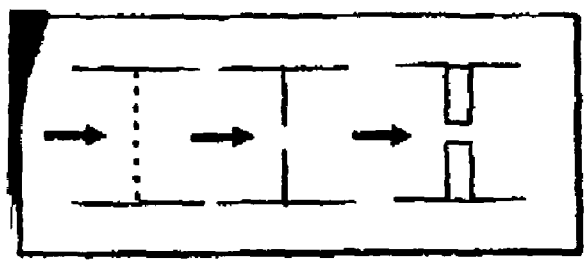
FIG. 3A illustrates a design of the restriction or nozzle used for obtaining choking conditions.
Figure 3B:
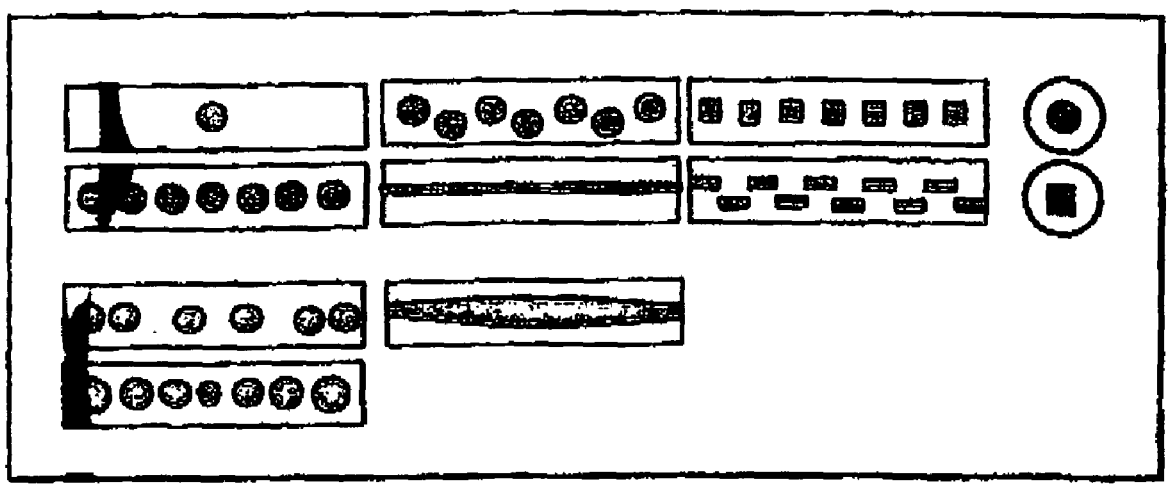
FIG. 3B illustrates another design of the restriction or nozzle used for obtaining choking conditions.

The restriction or nozzle used for obtaining choking conditions may be of various designs. Typically, one or more choking orifices (holes or slits) placed next to each other at carefully selected distance from the substrate or used. Examples are shown in FIGS. 3A (flow direction from left to right) and 3B (flow direction into the paper)

Figure 4A:
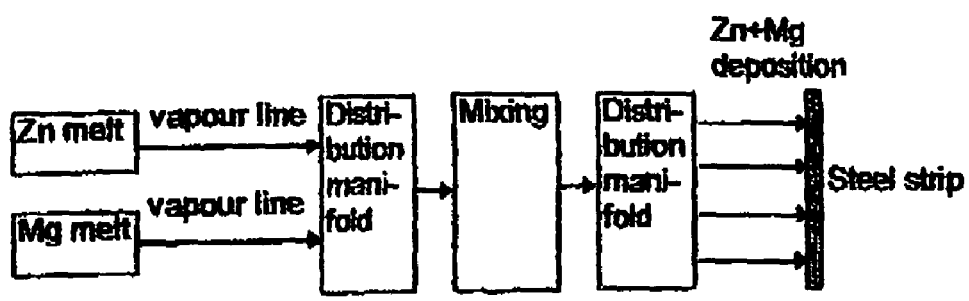
FIG. 4A depicts an apparatus which illustrates the principle of vapour deposition.
Figure 4B:
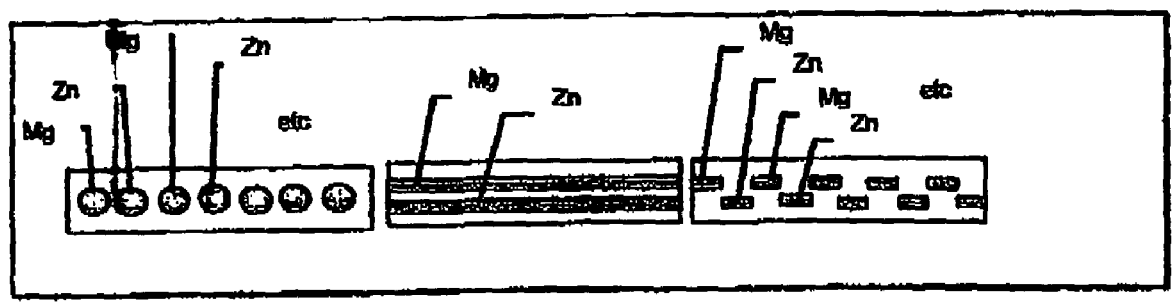
FIG. 4B depicts another apparatus which illustrates the principle of vapour deposition.

Hereafter additional details of the invention are given with reference to the (continuous, or semi-continuous) deposition of zinc and magnesium onto a steel strip. It will be clear that these examples can be extended to the deposition of other components and more than two components or just one component. The principle of the vapour deposition process is sketched in FIG. 4A. Separate restrictions for zinc and magnesium may have various configurations; examples are shown in FIG. 4B.

In the past problems have been encountered mixing zinc and magnesium in a fixed ratio. It was found that often only one element was more preferably deposited at the steel strip and that non-uniform mass transport was encountered. The main reason for this to occur is when a difference in vapour pressures exist between zinc and magnesium at the position where it is combined.

In case diffusion of magnesium and zinc is the main driving force for transport, this is caused by the fact that if the vapour pressure of one element is higher than that of the other element, the first element will flow toward the other element. The second element is then prevented to diffuse against the stream, and is thus effectively prevented from being deposited.

In experiments it appeared that in case a choking zinc orifice is placed next to a magnesium orifice, the mass flow magnesium or zinc is less than would be expected assuming choked flow in both the magnesium and zinc orifice. This indicates that interaction occurs of the flow after the zinc orifice and the magnesium orifice. Dependent on the conditions, the pressure after for example the zinc orifice can be too high for the magnesium orifice to become choked. In that case the mass flow magnesium is not well defined. In other cases the flow rate zinc is lower than expected.

Figure 5:
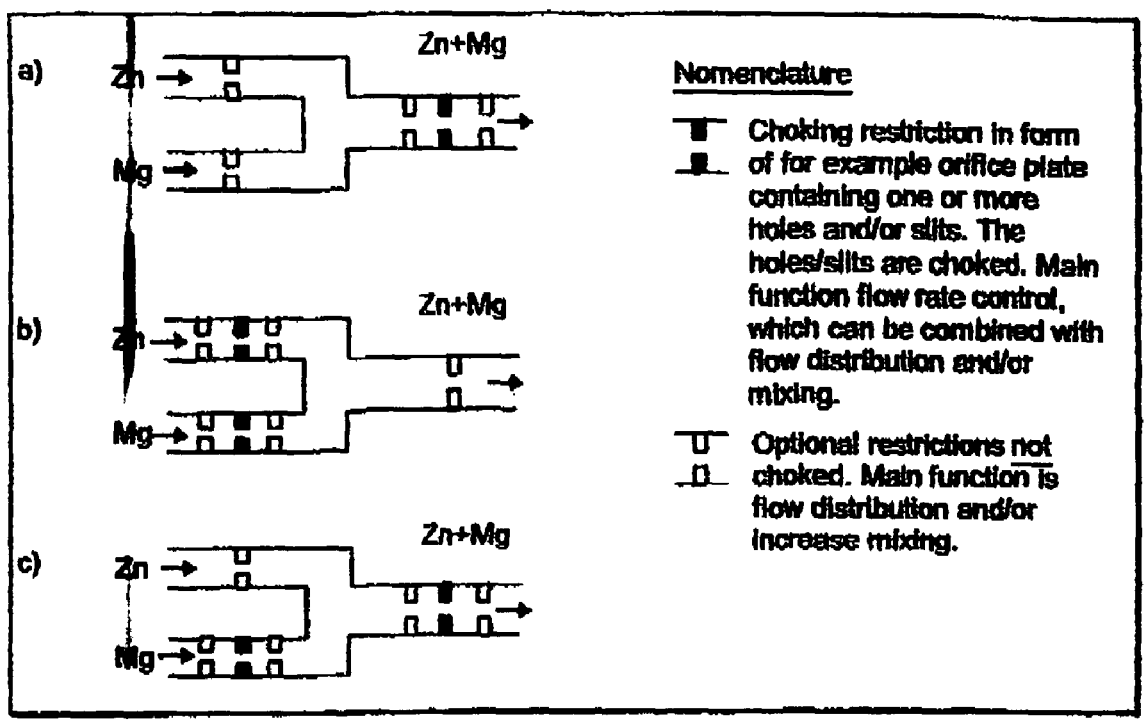
FIG. 5A illustrates an apparatus wherein the mixture flow rate is controlled by a choking restriction in the form of an orifice plate.
FIG. 5B illustrates an embodiment of the invention wherein both the flows of zinc and magnesium are controlled by a choked orifice plate.
FIG. 5C illustrates an embodiment of the invention wherein the flow of the mixture and the flow of one of the elements is controlled by choking orifices.

The observations described above lead to three designs, which are depicted in FIG. 5. Instead of zinc and magnesium as mentioned in FIG. 5, any other element can be substituted or the elements can be interchanged. The designs can be extended to cover more than 2 elements.

In FIG. 5a, the mixture flow rate is controlled by a choking restriction in the form of an orifice plate. The restriction is choked. Optional non-choking orifice plates can be introduced to enhance flow distribution and of mixing. In this setup, only the zinc-magnesium mixture is choked. The separate zinc and magnesium flows are not under choking conditions. Because the vapour pressures of both elements are different and there is an 'open' connection between the vessels, the mixture flow rate and composition will be difficult to control. Depending on circumstances, there may be a vapour flow from the vessel containing the element with highest vapour pressure towards the vessel containing the element with lower vapour pressure, and this flow may counteract or even prevent the diffusion of the element with lower vapour pressure towards the deposition site.

FIG. 5b shows a preferred embodiment of the invention. In this case both the flows of zinc and magnesium are controlled by a choked orifice plate. This enables a good control of the flow rate and ratio of both elements. To minimise interaction between the orifices, the pressures of zinc and magnesium are selected in such way that the critical pressures of zinc and magnesium at the choking orifices are approximately equal. The surface areas of each restriction is selected as to give the proper mass flow rates and vapour ratio's. Optional non-choking orifice plates can be introduced to enhance flow distribution and or mixing.

FIG. 5c shows a highly preferred embodiment of the invention. In this case, the flow of the mixture and the flow of one of the elements, e.g. magnesium, is controlled by choking orifices. The pressures of zinc and magnesium are selected in such a way that the critical pressure in the magnesium choking orifice is equal or somewhat higher than the back pressure after the orifice which is approximately equal to the zinc pressure. The surface areas of each restriction is selected as to give the proper mass flow rates and vapour ratio's. Optional non-choking orifice plates can be introduced to enhance flow distribution and or mixing.

Hereafter the invention is illustrated with reference to two practical examples, the deposition of a zinc-magnesium alloy, via the elements zinc and magnesium, onto a steel strip. Of course these examples should not be regarded in a restrictive manner. Many variations are possible, as will be clear to the skilled person. The deposition device is of the semi-continuous type, see FIG. 7a and FIG. 7b, that is, a coil with metal strip, typical a few hundred meter long, is placed into a batch vacuum chamber (19), and an automatic unwinding (16) and winding mechanism (17) transports the strip at the desired speed in front of the place of deposition (18). The chamber is connected to a vacuum pump (not shown).

Figure 6:
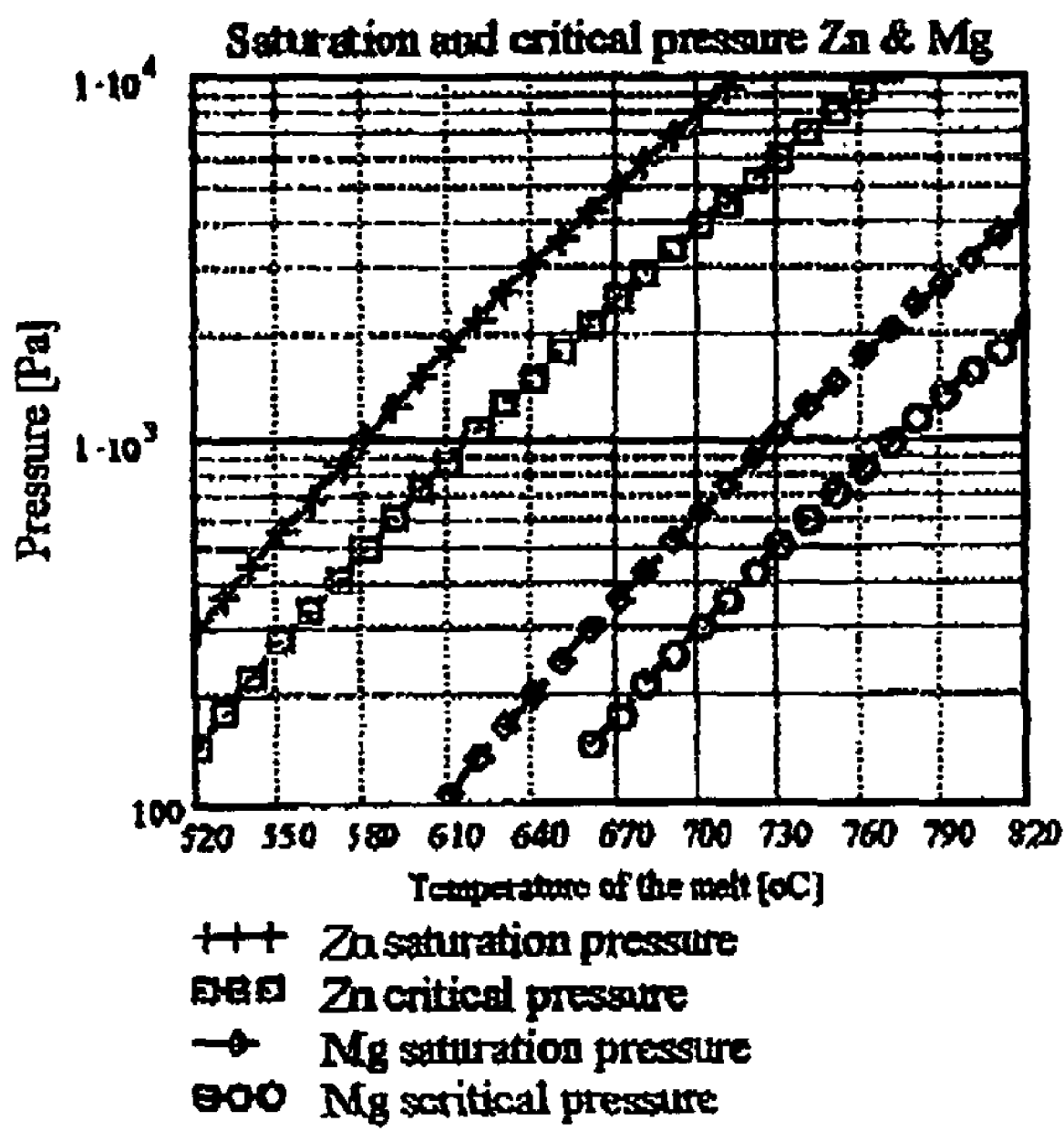
FIG. 6 illustrates the saturation vapour pressure of zinc and magnesium as function of temperature, together with the critical pressure of zinc and magnesium, as calculated with equation (2).

At deposition the pressure in the vacuum chamber is of the order of 1 Pa. The deposition device used has negligible vapour velocity in the evaporation vessel (20,21) and approximately isentropic flow does exist between vessel (20,21) and restriction (22,23,24,25), that is the stagnation pressure and temperature at the restriction is equal to the temperature and pressure in the evaporation vessel. FIG. 6 gives the saturation vapour pressure of zinc and magnesium as function of temperature, together with the critical pressure of zinc and magnesium, as calculated with equation (2) (see above).

Figure 7A:
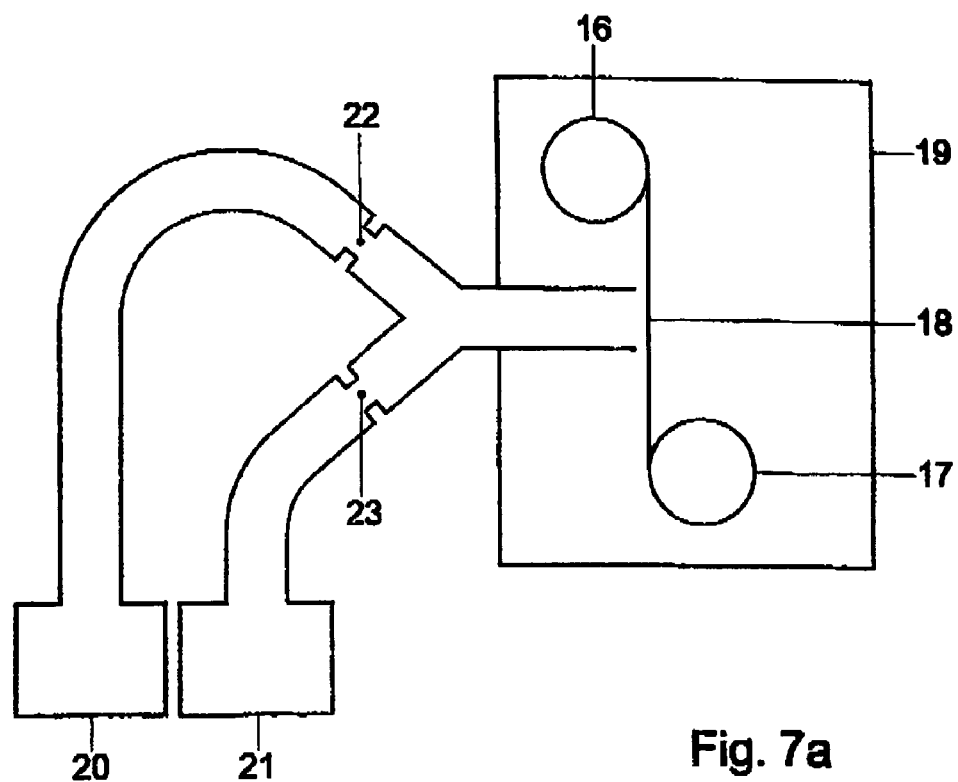
FIG. 7A illustrates a semi-continuous deposition device wherein zinc vapour is fed through a choked restriction and magnesium vapour is fed through a separate choked restriction.

In example 1, sketched in FIG. 7a, the zinc vapour is fed through a choked restriction (23), and magnesium vapour is fed through a separate choked restriction (22). After the restrictions the two vapours come together and are deposited. The conditions (melt temperature) of each vapour are selected in such a way that the critical pressure at the zinc restriction equals the critical pressure at the magnesium restriction. Taking for example the melt temperature Mg as 770° C. as a starting point, this corresponds to a critical magnesium pressure of 1000 Pa (see FIG. 6). To achieve the same critical pressure for zinc, the zinc melt temperature should be taken approximately 620° C. To obtain a coating of 5 μm with 6% magnesium on total weight at a strip-speed of 2 m/min, it was calculated with equation (1) that the effective surface area required for the zinc restriction was $1.27 \times 10-4$ m$^2$ and $1.57 \times 10-5$ m$^2$ for the magnesium restriction. Using these values in the experiment a coating thickness of 5.3 μm was obtained with a 6.7% magnesium content on total weight.

Figure 7B:
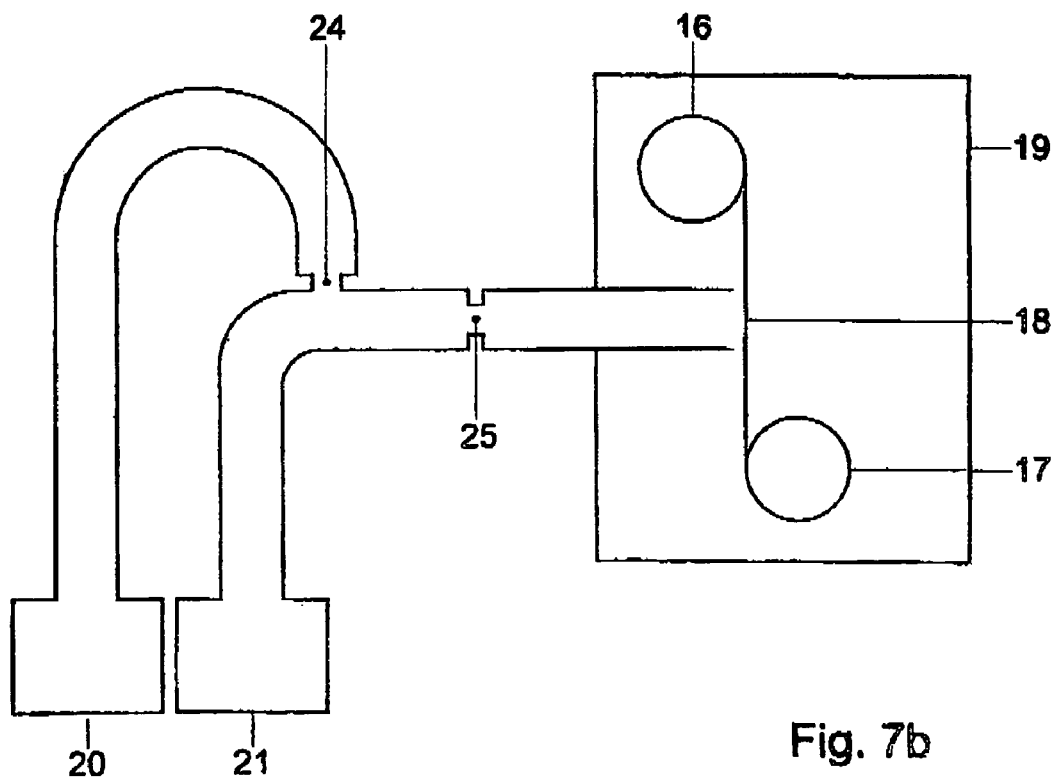
FIG. 7B illustrates another semi-continuous deposition device wherein a choked restriction is used to inject magnesium vapour at a controlled rate into the zinc vapour lines.

In example 2, sketched in FIG. 7b, a choked restriction (24) is used to inject magnesium vapour at a controlled rate into the zinc vapour line. The resulting zinc-magnesium mixture is now fed through another choking restriction (25), before it is deposited onto the strip. Because as projected the magnesium flow is less than that of zinc, it was considered favourable to inject magnesium with a relatively small restriction in the main flow and not vice versa. The magnesium vapour condition is now selected in such way that the critical magnesium pressure at the restriction (24) is equal to the upstream zinc pressure in the vessel. Taking as a starting point a zinc temperature of 524° C., the corresponding saturated zinc pressure in the vessel is 317 Pa. Assuming that this pressure also prevails in the zinc vapour line, the critical pressure of magnesium should favourably be equal or higher than 317 Pa, which corresponds to a magnesium pressure of 644 Pa and a temperature of 702° C. In the experiment a magnesium temperature of 733° C. was used. To get 10% magnesium by weight it was calculated with equation (1) that the effective surface area of the restrictions should be $3.2 \times 10-4$ m$^2$ for zinc-magnesium and $1.57 \times 10-5$ m$^2$ for magnesium. The measured coating magnesium content was 13% on average. In this way the outlined procedure gives a fast way to determine process conditions and surface area of the restrictions, which can be fine tuned upon needs.

The invention claimed is:

1. A process for applying a coating to a substrate, wherein at least a first vapour from a first vapour source and a second vapour from a second vapour source are deposited on said substrate under choking conditions, wherein said choking conditions are realized by having said first vapour and said second vapour flow either separately or jointly through a vapor line having at least one restriction with a cross-sectional area smaller than that of the vapor line and before an end of the vapor line, wherein the flow of said first vapour and said second vapour is sonic when said first vapour and said second vapour flow through the at least one restriction, and wherein said choking conditions prevent said first vapour from polluting said second vapour source and said second vapour from polluting said first vapour source upstream of the at least one restriction.

2. A process according to claim 1, wherein the substrate is a metal substrate.

3. A process according to claim 2, wherein the substrate is a steel sheet or strip.

4. A process according to claim 1, wherein the first and second vapours are metal vapours.

5. A process according to claim 4, wherein the first vapour is a zinc vapour and the second vapour is a magnesium vapour.

6. A process according to claim 1, wherein the vapours are mixed prior to deposition.

7. A process according to claim 6, wherein all vapours are choked prior to mixing.

8. A process according to claim 6, wherein at least one vapour is choked prior to mixing, and wherein the mixed vapours are choked after mixing.

9. A process according to claim 1, wherein choking conditions are maintained by controlling the critical pressures of the vapours to be substantially equal to each other.

* * * * *